(12) United States Patent
Chang et al.

(10) Patent No.: US 7,068,514 B2
(45) Date of Patent: Jun. 27, 2006

(54) PROTECTION STRUCTURE FOR THERMAL CONDUCTING MEDIUM OF HEAT DISSIPATION DEVICE

(75) Inventors: Chi-Lin Chang, Taipei (TW); Hui-Min Tsui, Taipei (TW)

(73) Assignee: CPUMATE Inc., Taipei (TW)

( * ) Notice: Subject to any disclaimer, the term of this patent is extended or adjusted under 35 U.S.C. 154(b) by 211 days.

(21) Appl. No.: 10/779,698

(22) Filed: Feb. 18, 2004

(65) Prior Publication Data
US 2005/0180115 A1 Aug. 18, 2005

(51) Int. Cl.
*H05K 7/20* (2006.01)

(52) U.S. Cl. ............... 361/705; 361/704; 361/708; 165/185; 257/707

(58) Field of Classification Search ........ 361/704–709, 361/710–719; 174/16.1, 16.3; 165/72, 73, 165/75, 80.3, 185; 257/719–722, 706–718; 206/701, 722, 724, 725, 713–717, 460, 813
See application file for complete search history.

(56) References Cited

U.S. PATENT DOCUMENTS

| | | | |
|---|---|---|---|
| 6,029,740 A * | 2/2000 | Lee et al. .................. 165/76 |
| 6,049,458 A * | 4/2000 | Lee et al. .................. 361/705 |
| 6,059,116 A * | 5/2000 | Hinshaw et al. ........... 206/714 |
| 6,935,420 B1 * | 8/2005 | Dong et al. ................ 165/185 |
| 6,952,348 B1 * | 10/2005 | Wu ........................... 361/719 |
| 2003/0075312 A1 * | 4/2003 | Panek ....................... 165/185 |
| 2003/0123228 A1 * | 7/2003 | Bhatia et al. .............. 361/705 |
| 2003/0150770 A1 * | 8/2003 | Campbell et al. .......... 206/722 |

* cited by examiner

Primary Examiner—Michael Datskovskiy

(57) ABSTRACT

A protection structure for a thermal conducting medium of a heat dissipation structure installed on the heat dissipation device at the position on which the thermal conducting medium is coated. The protection structure has a bottom surface to cover the thermal conducting medium, a side wall extending along and projecting from a periphery of the bottom surface to form a space for receiving the thermal conducting medium and a portion of the heat dissipation device, and a support structure protruding from the bottom surface to avoid a direct contact between the thermal conducting medium and the bottom surface.

14 Claims, 6 Drawing Sheets

PROTECTION STRUCTURE FOR THERMAL CONDUCTING MEDIUM OF HEAT DISSIPATION DEVICE

BACKGROUND OF THE INVENTION

The present invention relates to a protection structure for a thermal conducting medium of a heat dissipation device, and more particular, to a protection structure installed on the heat dissipation device at the position on which the thermal conducting medium is coated.

The commonly seen heat dissipation device such as the aluminum extrusion type heat dissipation device is attached on a central processing unit (CPU) to aid in heat dissipation when the central processing unit is operating. Thereby, the central processing can operate under a tolerable working temperature. Before the heat dissipation device is attached on the central processing unit, an adequate amount of thermal conducting medium such as thermal conductive paste is coated on the heat dissipation device, such that a close contact between the heat dissipation device and the central processing unit can be ensured.

The thermal conducting medium is typically in the form of a paste that easily cause adherence of dust and contamination. In case the heat dissipation device is dropped or in contact with external object before being attached to the central processing unit, the thermal conducting effect will be greatly degraded by the dust or contamination. In addition, the amount of the thermal conducting medium applied to the heat dissipation device is also a crucial parameter that affects the heat dissipation performance. Therefore, if the thermal conducting medium is coated by the end user who does not own a proper judgment of the amount, the heat dissipation performance may be degraded by improper amount of thermal conducting medium. If the thermal conducting medium is coated before the final assembly, dust and contamination is easily attached to the heat dissipation device, which again, causes degradation of heat dissipation.

BRIEF SUMMARY OF THE INVENTION

The present invention provides a protection structure for a thermal conducting medium of a heat dissipation device. The protection structure covers the thermal conducting medium to prevent dust and contamination adhered thereto.

The present invention further provides a protection structure for a thermal conducting medium of a heat dissipation device which also covers the heat dissipation device to provide a complete package of the heat dissipation device.

The protection structure provided by the present invention comprises a bottom surface to cover the thermal conducting medium, a side wall extending along and projecting from a periphery of the bottom surface to form a space for receiving the thermal conducting medium and a portion of the heat dissipation device, and a support structure protruding from the bottom surface to avoid a direct contact between the thermal conducting medium and the bottom surface. The support structure includes at least one pair of semi-spherical bumps, one pair of parallel ribs, or one pair of elongate ridges extending across the bottom surface. In the embodiment when the support structure includes a pair of elongate ridges extending across the bottom surface, the space formed by the sidewall is divided into a central space for receiving the thermal conducting medium and two spaces at two opposing sides of the central space. Preferably, the dimension of the central space is larger than the surface area of the thermal conducting medium.

The protection structure may further comprises a plurality of friction fit structure protruding from the side wall, such that the heat dissipation device inserted in the space can be secured to the protection structure. The friction fit structure includes a plurality of ribs. Preferably, the top edge of the side wall further includes a flange. The heat dissipation device includes a substrate, a plurality of fins projecting from a first surface of the substrate, and the thermal conducting medium attached to a second surface of the substrate. The bottom surface is conformal to the substrate. The side wall has a height lower than the height of the fins. In other embodiment, the side wall is level with the tips of the fins. The protection structure further comprises a lid to seal the heat dissipation device within the protection structure.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These, as well as other features of the present invention, will become apparent upon reference to the drawings wherein.

DETAILED DESCRIPTION OF THE INVENTION

Figure 1:
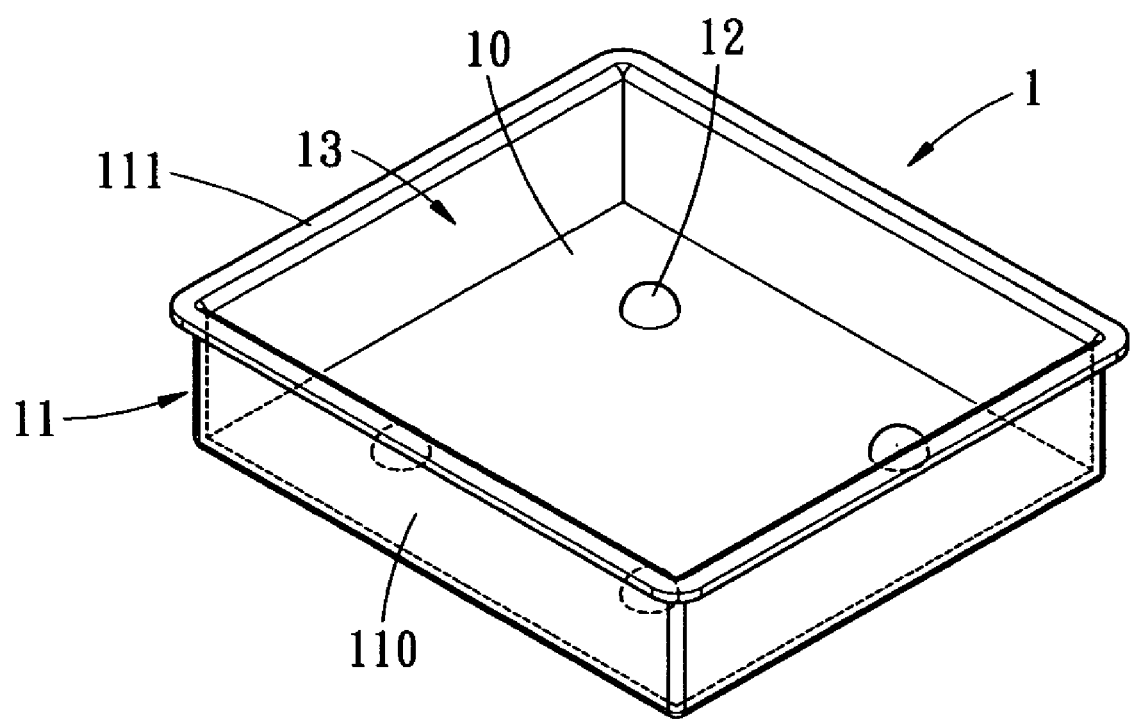
FIG. 1 shows a perspective view of a protection structure according to a first embodiment of the present invention.

Referring now to the drawings wherein the showings are for purpose of illustrating preferred embodiments of the present invention only, and not for purposes of limiting the same.

Figure 2:
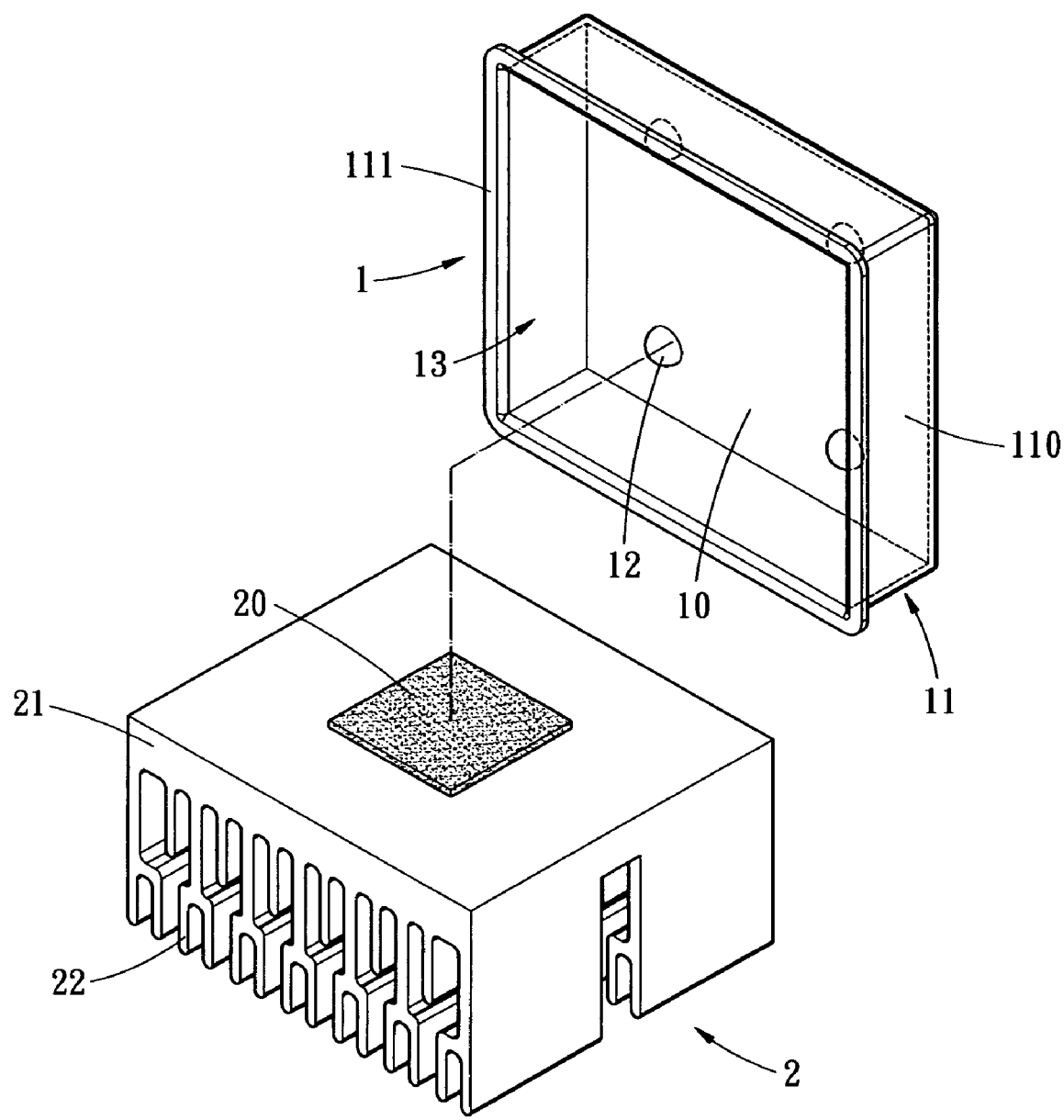
FIG. 2 shows an exploded view of the protection structure applied to a heat dissipation device.
Figure 3:
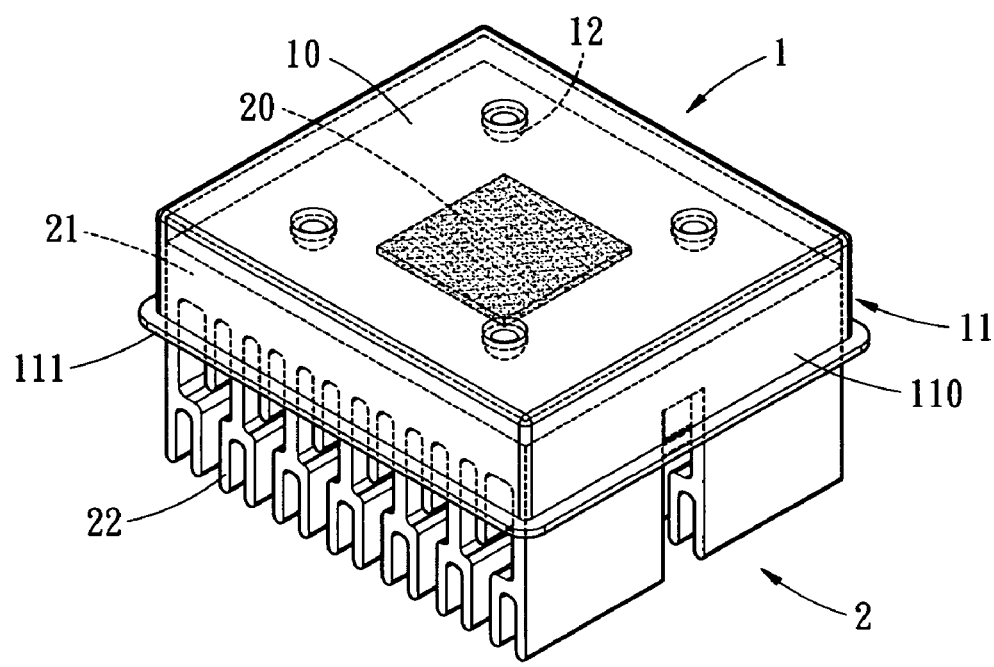
FIG. 3 shows a perspective view of the assembly of the protection structure and the heat dissipation device.
Figure 4:
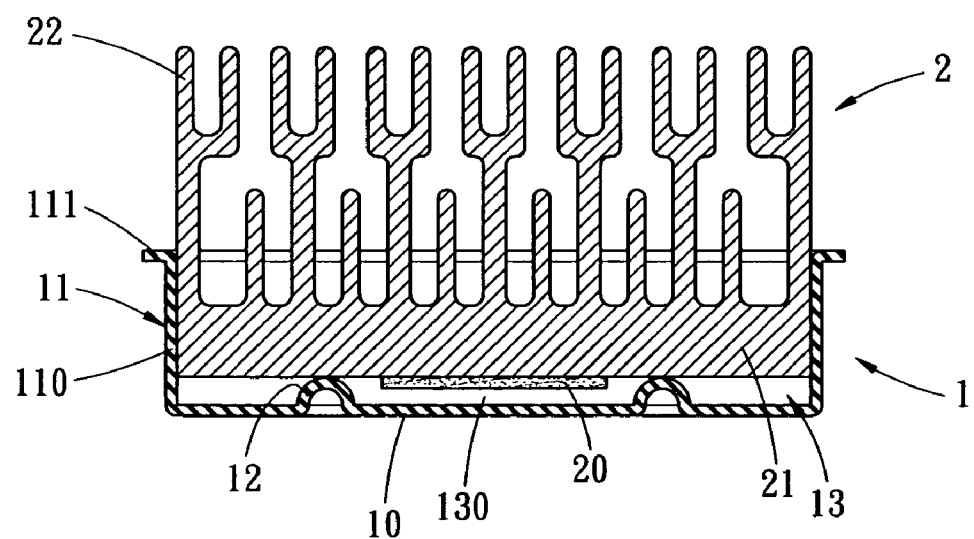
FIG. 4 shows a cross sectional view of the assembly.

A perspective view of a first embodiment of the protection structure is illustrated as FIG. 1, an exploded view the protection structure applied to a heat dissipation device is shown in FIG. 2, and FIG. 3 illustrates the perspective view of the assembly of the protection structure and the heat dissipation device. FIG. 4 shows the cross sectional view of the assembly. As shown, a heat dissipation device 2 is coated with a thermal conducting medium 20 such as a thermal conductive paste, and the protection structure 1 is used to cover and protect the thermal conducting medium 20 from being exposed to dust or contamination.

As shown in FIGS. 1 to 4, the protection structure 1 includes a bottom surface 10, a continuous side wall 11 extending substantially perpendicularly from the periphery of the bottom surface 10, and at least two contact portions 12 protruding inwardly from the bottom surface 10.

When the protection structure 1 is applied to the heat dissipation device 2, the bottom surface 10 is on top of the thermal conducting medium 20. As shown, the heat dissipation device 2 includes a heat sink formed by aluminum extrusion, for example. The heat sink includes a substrate 21 and a plurality of fins 22 formed on a top surface of the substrate 21. In this embodiment, the thermal conducting medium 20 is coated on the bottom surface of the substrate 21. Preferably, the contact portions 12 are spaced from each other to form a space larger than the surface area of the thermal conducting medium 20.

The continuous side wall 11 includes a plurality of side surfaces 110. Depending on the shape of the bottom surface 10, the arrangement of the side surfaces 110 may be altered. In the embodiment as shown in FIGS. 1 to 4, the bottom surface 10 has a rectangular shape, such that four side surfaces 110 construct the continuous side wall 11 in the example. When the bottom surface 10 is circular, only one side surface 110 is required. The bottom surface 10 and the side wall 11 forms a space 13 allowing a portion of the substrate 21 to be inserted therein. Preferably, the bottom surface 10 is conformal to the substrate 21.

When the substrate 21 is partially inserted in the space 13 of the protection structure 1, the contact portions 12 prevent the bottom surface 10 from contacting with and pressurizing against the thermal conducting medium 20. In the example as shown in FIG. 4, the contact portions 12 include four semi-spherical protrusions. By the contact portions 12, the substrate 21 is distant from the bottom surface 10 by a space 130 when the substrate 21 is inserted in the protection structure 1; and therefore, the thermal conducting medium 20 will not be damaged by the direct contact with the bottom surface 10.

In addition, the top edge of the continuous side wall 11 includes a flange 111 extend outwardly from the space 130. The flange 111 increases the structure strength and prevents the protection structure 1 from distortion. Further, it provides the convenience of inserting the substrate 21 into the space 130.

Figure 5:
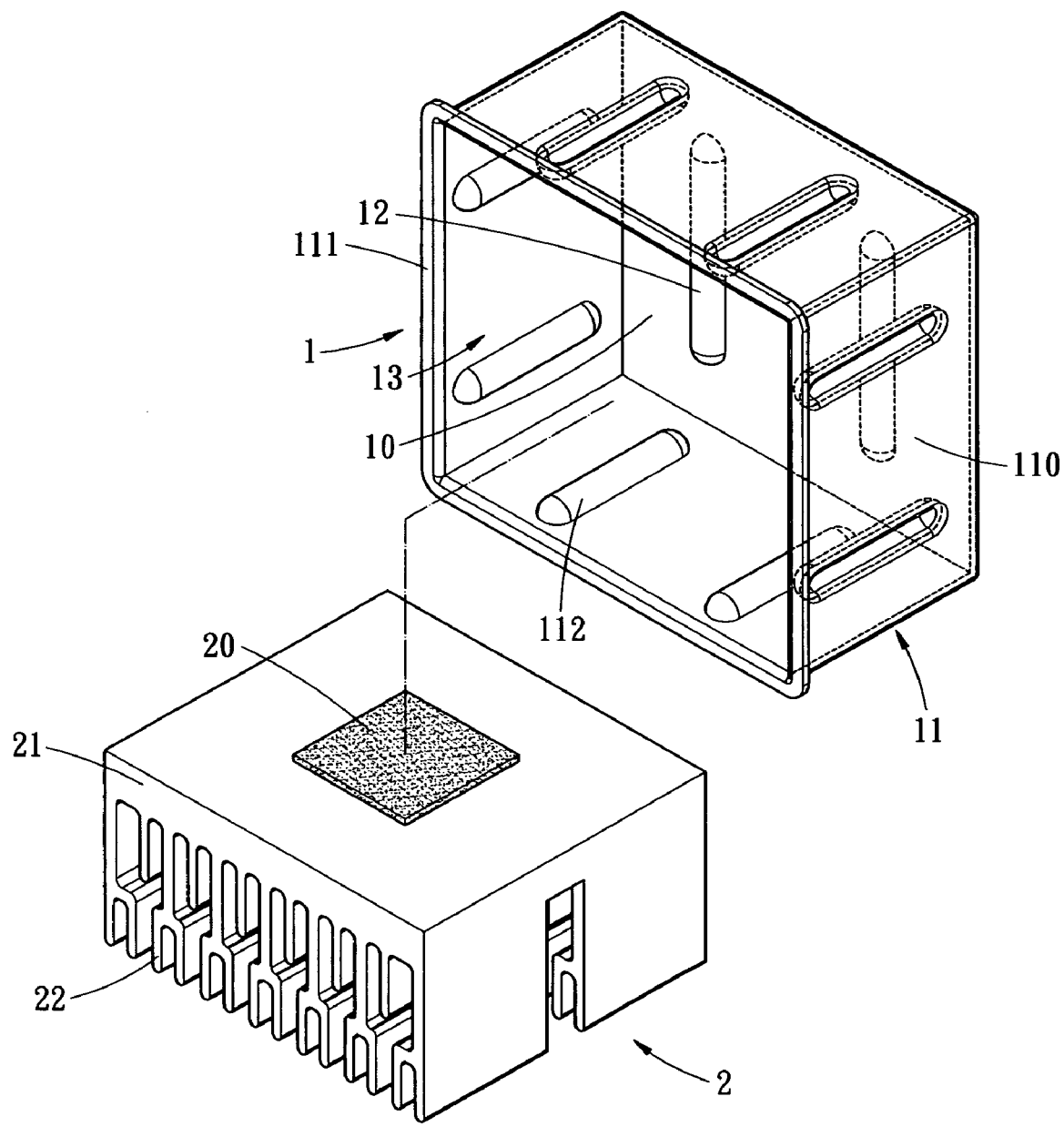
FIG. 5 shows an exploded view of a protection structure applied to a heat dissipation device according to a second embodiment of the present invention.
Figure 6:
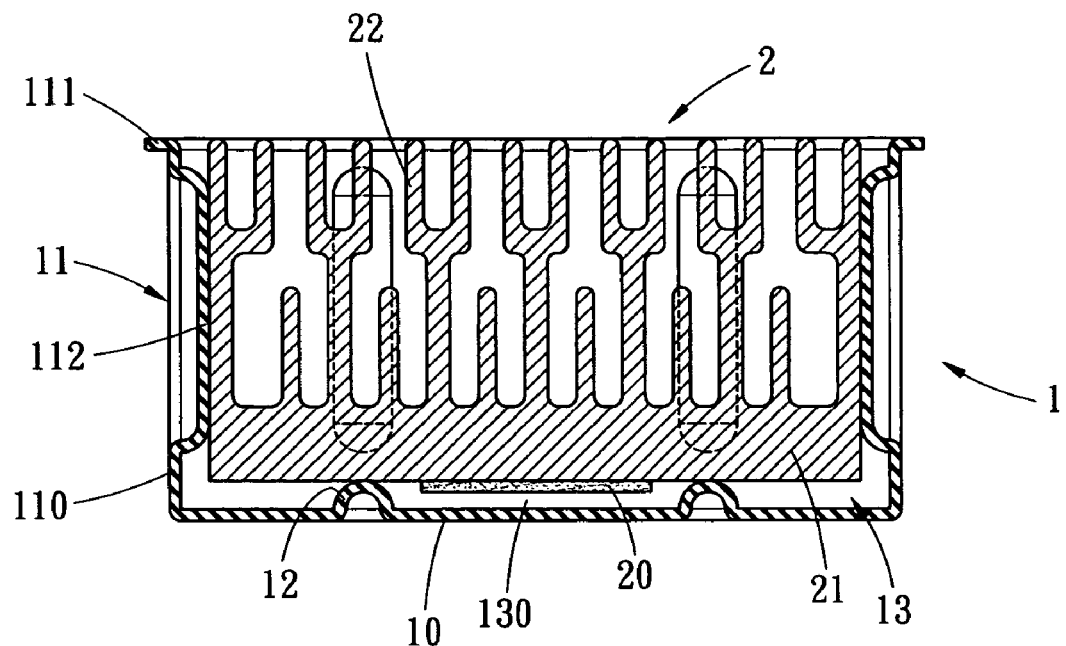
FIG. 6 shows a cross sectional view of the assembly as shown in FIG. 5.

FIGS. 5 and 6 shows a modification of the first embodiment of the protection structure 10. In this embodiment, the side wall 11 extends longer to cover the full height of the heat dissipation device 2, and the contact portions 12 includes a pair of protruding ridges formed the bottom surface 10. In addition to the contact portions 12, a pair of ridges protrudes inwardly from the side surfaces 110 to serve as fitting elements 112. Thereby, the protection structure 10 can secure the heat dissipation device 1 therein by friction fit. As shown, the tips of the fins 22 are level with the top edge of the side wall 11, and the protection structure 1 encloses the heat dissipation device 2 therein to be advantageous to package process.

Figure 7:
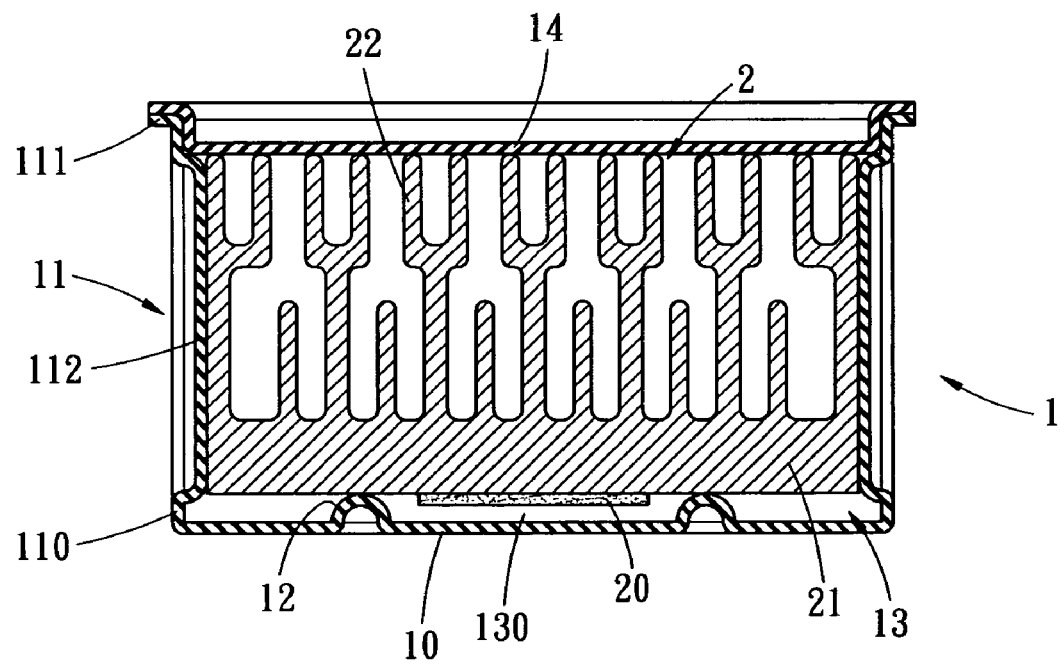
FIG. 7 shows a cross sectional view of an assembly of a protection structure and a heat dissipation device according to a third embodiment of the present invention.

FIG. 7 shows a third embodiment of the protection structure 1, which is a modification of the second embodiment. As shown, a lid 14 is added to cover the open end of the protection structure 1, such that the heat dissipation device 2 is sealed in the protection structure 1. The protection structure 1 thus serves as a package of the heat dissipation device 2 as well.

Figure 8:
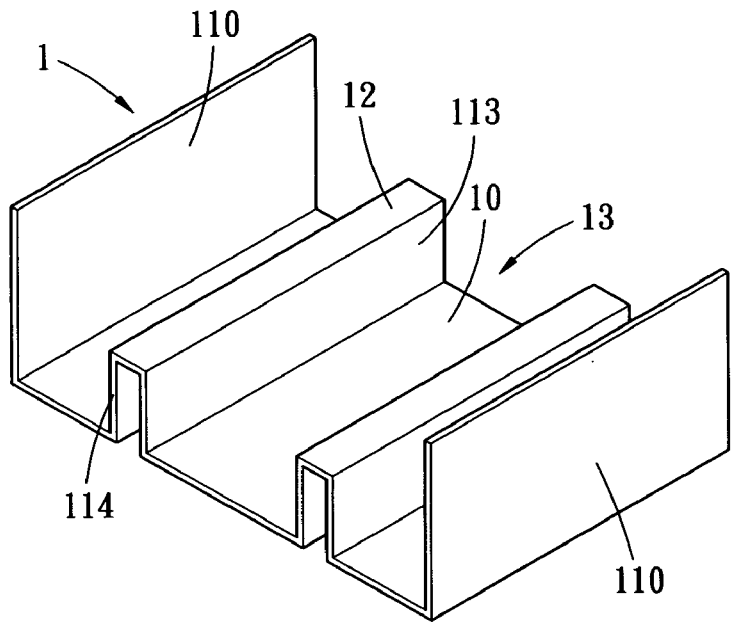
FIG. 8 shows a perspective view of a protection device according to a fourth embodiment of the present invention.
Figure 9:
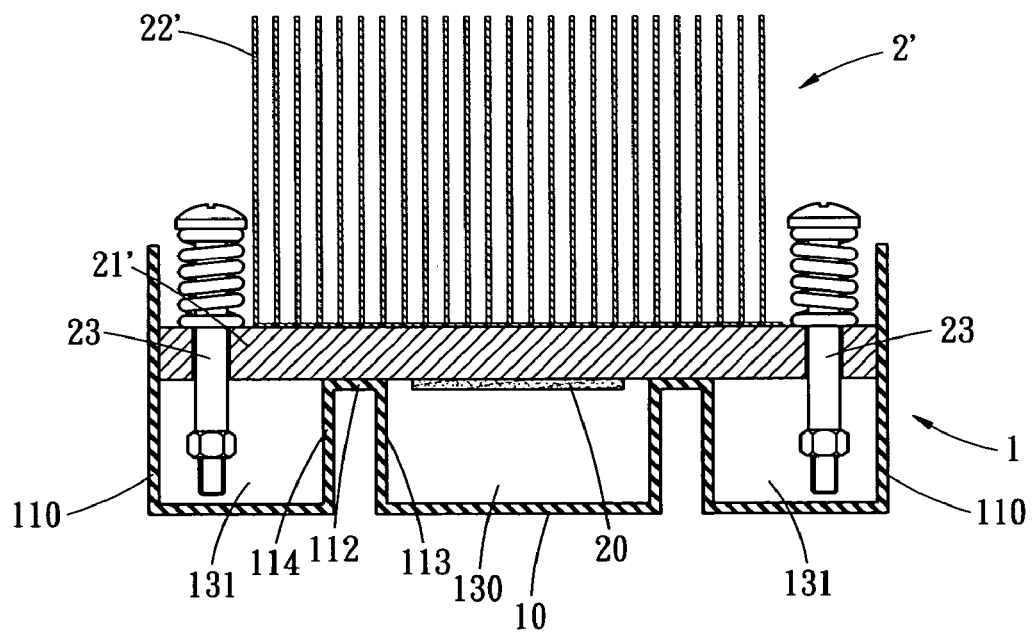
FIG. 9 shows a cross sectional view of the protection device as shown in FIG. 8 applied to a heat dissipation device.

FIG. 8 illustrates the perspective view of a protection structure in a fourth embodiment of the present invention, and FIG. 9 shows a cross sectional view of the assembly of the protection structure and a heat dissipation device. As shown, the heat dissipation device 2' includes a substrate 21' and a stack of fins 22' attached on the substrate 21'. The substrate 21' further includes a plurality of resilient fastening members 23 penetrating through the substrate 21'.

The protection structure 1 includes a bottom surface 10, a pair of side surfaces 110, and a pair of elongate ridges 114 protruding from the bottom surface 10. As shown, the elongate ridges 114 extending from one edge to the other of the bottom surface 10 and are parallel to the side surfaces 110. Preferably, the height of the side surfaces 110 is higher than that of the ridges 12, and the space 13 formed between the side surfaces 110 is slightly larger than that of the substrate 21'. Therefore, the heat dissipation device 2' can be partially disposed in the space 13. The lower portion of the space 13 is divided into three parts, including the central portion 130 between the ridges 12 and the side portions 131 between the ridges 12 and the side surfaces 110. When the heat dissipation device 2' is inserted in the space 13, the protruding ridges 12 serves as supporting arms of the substrate 21'. Each of the protruding ridges 12 includes a side wall 114 facing the side surface 110, a side wall 113 facing the side wall 113 of the other ridge 12, and a top wall 112. The top wall 112 is in direct contact with the substrate 21' when the heat dissipation device 1 is inserted in the space 13. Further, the distance between the ridges 12, that is, the dimension of the space 130 is preferably larger than the dimension (width or length) of the thermal conducting medium 20, such that the thermal conducting medium 20, while being covered and protected by the protection structure 1, is not in contact with any structure or element. The spaces 131 allow the fastening members 23 to insert therein.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A protection structure for a thermal conducting medium of a heat dissipation device, comprising:
    a bottom surface, being substantially flat to cover the thermal conducting medium;
    a side wall extending along and projecting from a periphery of the bottom surface to form a space for receiving the thermal conducting medium and a portion of the heat dissipation device; and
    a dented support structure formed in and protruding from the bottom surface to contact on the heat dissipation device so as to avoid a direct contact between the thermal conducting medium and the bottom surface.

2. The structure of claim 1, wherein the dented support structure includes a plurality of dented bumps protruding from the bottom surface.

3. The structure of claim 1, wherein the dented support structure includes a pair of dented ridges protruding from and extending across the bottom surface.

4. The structure of claim 3, wherein the space formed by the side wall is divided into a central space for receiving the thermal conducting medium and a pair of side spaces.

5. The structure of claim 4, wherein the surface area of the central space is larger than the surface area of the thermal conducting medium.

6. The structure of claim 1, further comprising a plurality of dented friction fit structure protruding from the side wall.

7. The structure of claim 6, wherein the friction fit structure includes a plurality of dented ribs.

8. The structure of claim 1, wherein the top edge of the side wall further includes a flange.

9. The structure of claim 1, wherein the heat dissipation device includes a substrate, a plurality of fins projecting from a first surface of the substrate, and the thermal conducting medium attached to a second surface of the substrate.

10. The structure of claim 9, wherein the bottom surface is conformal to the substrate.

11. The structure of claim 9, wherein the side wall has a height lower than the height of the fins.

12. The structure of claim 9, wherein the side wall is level with the tips of the fins.

13. The structure of claim 12, further comprising a lid to seal the heat dissipation device within the protection structure.

14. The structure of claim 1, wherein the support structure includes a pair of parallel dented ribs.

* * * * *